United States Patent [19]

Lechter et al.

[11] Patent Number: 5,079,220
[45] Date of Patent: Jan. 7, 1992

[54] PROCESS FOR SINGLE CRYSTAL GROWTH OF HIGH $T_c$ SUPERCONDUCTORS

[75] Inventors: William L. Lechter, Rockville, Md.; Louis E. Toth, Washington, D.C.; Badri N. Das, Upper Marlboro; Stuart A. Wolf, Bowie, both of Md.

[73] Assignee: The United States of America as represented by the Secretary of the Navy, Washington, D.C.

[21] Appl. No.: 356,496

[22] Filed: May 25, 1989

[51] Int. Cl.$^5$ ............................................. C30B 11/04
[52] U.S. Cl. ....................................... 505/1; 505/729; 156/600; 156/624
[58] Field of Search .................... 156/600, 624; 505/1, 505/729; 423/593

[56] References Cited

PUBLICATIONS

Das et al., "Growth of Single Crystals of $YBa_2Cu_3O_7$", Journal of Crystal Growth, vol. 85 (1987) pp. 588–592.
Hermann et al., "Melt-Processible Rare Earth Ba--Cu-O Superconductors Based on Molten Ba-Cu-Oxides", Appl. Phys. Lett. 51(22), 11/30/87, pp. 1854–1855.
Morris et al., "Preparation of High Quality, Single Crystals of 90k Superconducting $YBa_2Cu_3O_7$", Mat. Res. Soc. Symp. Proc., vol. 19, 1988, pp. 43–46.
Konaka et al., "New Procedure for Single Crystal Growth of $YBa_2Cu_3O_x$", Journal of Crystal Growth, vol. 91 (1988) pp. 278–281.
Liu et al., "Superconductivity and Structure of Single Crystal $YBa_2Cu_3O_x$", Physics Letters A, vol. 121, No. 6, 4 May 1987, pp. 305–306.
Scheel et al., "Growth of Separated $YBa_2Cu_3O_{7-x}$, Crystals," Mat. Res. Soc. Symp. Proc., vol. 99, 1988, 595–599.
Oda et al., "The Meissner Effect of the Small Single Crystals of $Ba_2YCu_{2.89}O_{6.80}$", Japn. Jour. of Applied Physics, May 1987, L809–L811.
Schneemeyer et al., "Superconductivity in $YBa_2Cu_3O_7$ Single Crystals", Nature, vol. 328, 13 Aug. 1987, pp. 601 to 603.
Menken et al., "The Crystal Growth of $ReBa_2Cu_3O_{7-x}$ (RE=Y and Er) High-$T_c$ Superconducting Compounds", Jour. Cry. Growth 91 (1988) pp. 264–267.
Tajima et al., "High $T_c$ Superconducting Single Crystal $Eu_1Ba_2Cu_3O_y$", Journal of Crystal Growth 85 (1987) pp. 665–668.
Balestrino et al., "Growth of Single Crystals of the High-Temperature Superconductor $YBa_2Cu_3O_{7-x}$", Jour. of Crystal. Growth, vol. 85 (1987) pp. 585–587.
Lechter et al., "Novel Techniques for Crystal Growth of Superconducting $ErBa_2Cu_3O_7$", printed in Journal of Superconductivity, vol. 1, No. 2, Jun. 1988.
Kaiser et al., "Growth of $YBa_2Cu_3O_x$ Single Crystals", printed in Appl. Phys. Lett., vol. 51, (13), p. 1040 (1987).
Adachi et al., "Conference Booklet:", 18th International Conference on Low Temperature Physics, (Kyoto, 1987, p. 322).
"Superconductor Update", High-Tech Materials Alert, vol. 5, No. 2, p. 9 (Feb. 1988).

*Primary Examiner*—Robert Kunemund
*Attorney, Agent, or Firm*—Thomas E. McDonnell; Barry A. Edelberg

[57] ABSTRACT

Large oriented crystals greater than one millimeter in length of high $T_c$ superconducting compounds are grown by mixing starting materials in the correct proportions to make the superconducting compound, forming a mixture. The $CO_2$ is removed from the mixture and the ternary oxide of the compound is formed from the mixture. Next, the mixture is formed into a self-supporting green body and sintered at a sintering temperature at which the top of the self-supporting green body is molten and the bottom surface is solid. The self-supporting green body is held at the sintering temperature for a time, forming a sintered body. Next, the sintered body is cooled so that crystals form. After this step, the crystals can be further processed to increase their superconducting properties. Finally, the crystals are removed and processed for use.

27 Claims, No Drawings

PROCESS FOR SINGLE CRYSTAL GROWTH OF HIGH $T_c$ SUPERCONDUCTORS

BACKGROUND OF THE INVENTION

1. Field of the Invention

This invention relates to a novel process for growing crystals of high $T_c$ superconductors. More specifically, the invention pertains to a process for growing oriented crystals of high $T_c$ superconducting compounds greater than one millimeter in length.

2. Description of the Prior Art

Much has been reported regarding growing large crystals (i.e. crystals greater than one millimeter in length) of superconducting $YBa_2Cu_3O_7$. Such growth of $YBa_2Cu_3O_7$, as well as its rare earth counterparts, such as $ErBa_2Cu_3O_7$, is difficult because of the compound's chemical reactivity, its peritectic decomposition, and the relatively high temperatures involved. It has been reported that good quality, millimeter sized crystals were grown using a liquid flux consisting of $CuO$ and $BaCuO_2$ in which the crystals grew from the liquid that had migrated out of the crucible onto a gold substrate support. D. L. Kaiser, F. Holtzberg, B. A. Scott, and T. R. McGuire, *Appl. Phys. Lett.* 51, 1040 (1987). However, while there are intense efforts to grow crystals of $YBa_2Cu_3O_7$, little has been reported on the growth of the rare earth counterparts of this phase, such as $ErBa_2Cu_3O_7$. This is because no one has succeeded in growing large, oriented crystals of the high $T_c$ rare earth superconducting materials.

SUMMARY OF THE INVENTION

Accordingly, it is an object of this invention to provide a method for growing large, oriented crystals of high $T_c$ superconducting materials.

It is a further object of this invention to provide a method for growing large, oriented crystals of high $T_c$ superconducting materials in such a manner that the superconducting properties of the crystals may be increased.

These and additional objects of the invention are accomplished by mixing the starting materials in the correct proportions to make the superconducting compound, forming a mixture. The $CO_2$ is removed from the mixture and the ternary oxide of the compound is formed from the mixture. Next, the mixture is formed into a self-supporting green body and sintered at a sintering temperature at which the top of the self-supporting green body is molten and the bottom surface is solid. The self-supporting green body is held at the sintering temperature for a time, forming a sintered body. Next, the sintered body is cooled so that crystals form. The crystal growth is oriented along a plan which is parallel or at least essentially parallel to the top surface of the sintered body. After this step, the crystals can be further processed to increase their superconducting properties. Finally, the crystals are removed and processed for use.

DETAILED DESCRIPTION OF THE INVENTION

A method to grow large oriented single crystals is needed because many devices require such a crystal. For example, high speed computers could use a silicon chip with a single large high $T_c$ crystal. The method of the invention can provide such needed crystals. The starting materials should be micron-sized powders of the compounds in the correct stoichiometric proportions to make the desired high $T_c$ superconductor. In the preferred embodiment, the superconducting compound is $XBa_2Cu_3O_7$, where X is any member of the lanthanide series, including lanthanum. In the most preferred embodiment, X is selected from the group of lanthanides consisting of Er and Nd. Preferably, the starting materials are oxide(s) of an alkaline earth metal and $X_2O_3$. In the most preferred embodiment, the starting materials are $CuO$, $BaCO_3$ and $X_2O_3$.

The powders are mixed, the $CO_2$ removed from the resulting mixture and the ternary oxide formed. In the preferred embodiment, the $CO_2$ is removed by calcining the powder mixture long enough to remove the $CO_2$ at a temperature of between about 500°-950° C. In the most preferred embodiment, the calcining is carried out for about 3 to 12 hours at about 900° to 950° C. Since calcination results in some grain growth that, to a certain degree, inhibits subsequent sintering, it is preferable to mill the calcined mixture until the particle size is approximately 0.8 to 1.2 micrometers in diameter. In the most preferred embodiment of the invention, the particle size is about one micrometer in diameter.

Subsequent to removing the $CO_2$ and forming the ternary oxide, the mixture is cold-pressed into a green body which is self-supporting. Preferably, this is accomplished by pressing the resultant mixture into a disk between about 5 to 7 mm in thickness, with a thickness of 5 mm being most preferred. Since the disk must be self-supporting (i.e. it can't break when moved), it is also preferable to add a few drops of a binding agent, such as stearic acid, to the resultant mixture before pressing. Any means of cold-pressing may be used, but it is preferable to use a steel die. In the most preferred embodiment, a steel die of about 50 to 60 mm inside diameter capable of pressing with a load of between about 8,000 to 12,000 kg, most preferably about 10,500 kg, is used.

Next, the self-supporting green body is placed on a non-reactive support, such as a gold-coated alumina plate, so that the self-supporting green body may be sintered. In the preferred embodiment, the sintering is accomplished by slowly heating the self-supporting green body in air so that the self-supporting green body does not crack due to outgassing. A heating rate of between about 0.5° to 10° C. per minute is preferred, with a heating rate of 0.5° C. being most preferred. The self-supporting green body is heated to a temperature such that the top surface of the self-supporting green body forms a liquid flux that is supported by the bottom surface of the body, which remains a solid.

A liquid flux is more easily obtained if an excess of an oxide selected from the group comprising $CuO$ and $BaCuO_2$ is added to the original powder mixture. When an excess of an oxide selected from the group comprising $CuO$ and $BaCuO_2$ is present in the self-supporting green body, the self-supporting green body is heated to between about 900° and 970° C., with 940° C. being most preferred. The self-supporting green body is kept at that temperature for a sufficient time to grow crystals—usually until some melt and some initial crystal growth are observed. In the preferred embodiment, between about 4 to 12 hours is sufficient time, with 8 hours being most preferred. The resulting sintered body is then cooled to about ambient room temperature, at a slow enough rate so that large crystals form. In the preferred embodiment, a cooling rate of between about 0.25° to 3° C. is sufficient, with a cooling rate of 1° C. per minute most preferred.

At this point, the crystals may be removed from the top surface of the sintered body. However, one can improve the superconducting properties of the compound by increasing the percentage of orthorhombic phase over the tetragonal phase in the crystals. Preferably, this is done by reheating the sintered body (before removing the crystals) in an oxygen rich atmosphere. In the preferred embodiment, the sintered body is reheated in flowing oxygen at about 5° C. per minute to a temperature just below the melting point of the mixture. The sintered body is held at that temperature for between about 18 to 22 hours and then cooled to about room temperature at the same rate used for the first cooling. In the most preferred embodiment, the sintered body is reheated to about 937° C., and held at that temperature for about 20 hours.

The percentage of the orthorhombic phase in the crystals can be increased further by a second heating of the reheated sintered body. Preferably, the reheated sintered body is heated for between about 10 to 14 hours at between about 500 to 600° C. in an oxygen rich atmosphere having between about 200 to 500 kPa of oxygen pressure. It is most preferred to heat at about 550° C. for about 12 hours under about 400 kPa of oxygen pressure.

Having described the invention, the following examples are given to illustrate specific applications of the invention. These specific examples are not intended to limit the scope of the invention described in this application.

EXAMPLE 1

Micron-sized powders of $Er_2O_3$, $CuO$ and $BaCO_3$ were carefully mixed in the correct stoichiometric proportions to make $ErBa_2Cu_3O_7$. Excess CuO was added to the mixture, so that the stoichiometry was actually $ErBa_2Cu_3O_7$. This powder mixture was then calcined at 900° C. for 3 hours on platinum sheets to remove the $CO_2$ and to form the ternary oxide. The calcined powders were then milled using alumina balls until the particle size was 1 μm. A few drops of stearic acid (as a binding agent) were added to the powders. The powders were then pressed in a 57-mm-inside-diameter steel die at a load of 10,442 kg. The thickness of the pressed disk was 5 mm. The cold-pressed disk was transferred to a gold coated alumina plate that supported it during the sintering process.

The pressed disk and alumina support plate were then placed in a box furnace and heated in air at 0.5° C. per minute to 940°. After reaching 940° C., the furnace was held at that temperature for 8 hours and then cooled at 1° C. per minute, down to room temperature.

The disk was then reheated in flowing oxygen at 5° C. per minute to 937° C., held there for 20 hours and cooled at 1° C. per minute to room temperature. This "once-fired" disk was then reheated for 12 hours at 585° C. at 400 kPa of oxygen pressure.

The large single crystals were then cut from the disk and polished.

EXAMPLE 2

Micron-sized powders of $Nd_2O_3$, $CuO$ and $BaCO_3$ were carefully mixed in the correct stoichiometric proportions to make $NdBa_2Cu_3O_7$. Excess CuO and $BaCuO_2$ was added to the mixture, so that the stoichiometry was actually $NdBa_2Cu_{4.5}O_7$. This powder mixture was then calcined at 900° C for 3 hours on platinum sheets to remove the $CO_2$ and to form the ternary oxide. The calcined powders were then milled using alumina balls until the particle size was 1 μm. A few drops of stearic acid (as a binding agent) were added to the powders. The powders were then pressed in a 57-mm-inside-diameter steel die at a load of 10,442 kg. The thickness of the pressed disk was 5 mm. The cold-pressed disk was transferred to a gold coated alumina plate that supported it during the sintering process.

The pressed disk and alumina support plate were then placed in a box furnace and heated in air at 0.5° C. per minute to 940°. After reaching 940° C., the furnace was held at that temperature for 8 hours and then cooled at 1° C. per minute, down to room temperature.

The disk was then reheated in flowing oxygen at 5° C. per minute to 937° C., held there for 20 hours and cooled at 1° C. per minute to room temperature. This "once-fired" disk was then reheated for 12 hours at 585° C. at 400 kPa of oxygen pressure.

The large single crystals were then cut from the disk and polished. Obviously, many modifications and variations of the present invention are possible in light of the above teachings. It is therefore to be understood that within the scope of the appended claims, the invention may be practiced otherwise than as specifically described.

What we claim is:

1. A method for the oriented growth of large oriented crystals of high $T_c$ superconducting compounds comprising the steps of:
   mixing $CuO$, $BaCO_3$ and $X_2O_3$ to form a mixture, where X is a lanthanide;
   reacting said $CuO$, $BaCO_3$ and $X_2O_3$ in said mixture by removing $CO_2$ therefrom to form a ternary oxide;
   pressing the ternary oxide into a self-supporting green body;
   heating the self-supporting green body to a sintering temperature at which the self-supporting green body has a top surface forming a liquid flux that is supported by a sold bottom surface;
   maintaining the self-supporting green body at the sintering temperature for a time sufficient to grow crystals comprising $XBa_2Cu_3O_7$ on the top surface of said substrate, said crystal growth being oriented along a plane essentially parallel to said top surface, and to form a sintered body;
   cooling the sintered body;
   removing said crystals from the top surface of the sintered body.

2. A method as described in claim 1 wherein X is selected from the group of lanthanides consisting of Er and Nd.

3. A method as described in claim 1 wherein the self-supporting green body is held at said sintering temperature for between about 4 to 12 hours.

4. A method as described in claim 3 wherein the self-supporting green body is held at said temperature for about 8 hours.

5. A method as described in claim 1 wherein the self-supporting green body is in disk form.

6. A method as described in claim 5 wherein the disk is heated at a rate of between about 0.5° to 10° C. per minute.

7. A method as described in claim 6 wherein the disk is heated at a rate of about 0.5° C. per minute.

8. A method as described in claim 5 wherein the disk is cooled at a rate of between about 0.25° to 3° C. per minute.

9. A method as described in claim 8 wherein the disk is cooled at a rate of about 1° C. per minute.

10. A method as described in claim 8 wherein the disk is cooled to about ambient room temperature.

11. A method as described in claim 1 wherein an excess of an oxide selected from the group comprising CuO and $BaCuO_2$ is present in the self-supporting green body.

12. A method as described in claim 11 wherein X is Er and said sintering temperature is between about 900° C. and 970° C.

13. A method as described in claim 12 wherein said sintering temperature is about 940° C.

14. A method as described in claim 11 wherein the $CO_2$ is removed and the ternary oxide formed by calcining the mixture at a temperature between about 500° and 950° C. until the $CO_2$ is removed.

15. A method as described in claim 14 wherein the mixture is calcined at a temperature between about 900° to 950° C. for between about 3 to 12 hours.

16. A method as described in claim 14 comprising the further step of milling the mixture after the step of forming the ternary oxide.

17. A method as described in claim 16 wherein the mixture is milled until the particle size of the mixture is about 1 micrometer.

18. A method as described in claim 5 wherein the mixture is formed into a disk under a load of about 8,000 to 12,000 kg.

19. A method as described in claim 18 wherein the load is about 10,500 kg.

20. A method as described in claim 19 wherein the disk is about 5 to 7 millimeters in thickness.

21. A method as described in claim 20 wherein the disk is about 5 millimeters in thickness.

22. A method as described in claim 18 wherein the disk is formed using a steel die of about 50 to 60 mm inside diameter.

23. A method as described in claim 22 wherein the steel die is about 57 mm inside diameter.

24. A method as described in claim 5 further comprising the step of adding a binding agent to the mixture before forming the mixture into a disk.

25. A method as described in claim 24 wherein the binding agent is stearic acid.

26. A method for the oriented growth of large oriented crystals of high $T_c$ superconducting compounds comprising the steps of:

mixing CuO, $BaCO_3$ and $X_2O_3$ to form a mixture, where X is a lanthanide;

reacting said CuO, $BaCO_3$ and $X_2O_3$ in said mixture by removing $CO_2$ therefrom to form a ternary oxide;

pressing the ternary oxide into a self-supporting green body;

heating the self-supporting green body to a sintering temperature at which the self-supporting green body has a top surface forming a liquid flux that is supported by a sold bottom surface;

maintaining the self-supporting green body at the sintering temperature for a time sufficient to grow crystals comprising $XBa_2Cu_3O_7$ on the top surface of said substrate, said crystal growth being oriented along a plane essentially parallel to said top surface, and to form a sintered body;

cooling the sintered body;

heating the sintered body in a substantially pure oxygen atmosphere to a temperature below the sintering temperature to form a reheated sintered body;

cooling the reheated sintered body; and removing said crystals from the top surface of the reheated sintered body.

27. A method as described in claim 26 comprising the additional steps, after cooling the reheated sintered body, of heating the reheated sintered body in a substantially pure oxygen atmosphere under about 300 to 500 kPa of oxygen pressure to a temperature below the sintering temperature; and cooling the reheated sintered body.

* * * * *